US006965533B2

(12) United States Patent
Sakata et al.

(10) Patent No.: US 6,965,533 B2
(45) Date of Patent: Nov. 15, 2005

(54) SEMICONDUCTOR DEVICE WHICH IS LOW IN POWER AND HIGH IN SPEED AND IS HIGHLY INTEGRATED

(75) Inventors: Takeshi Sakata, Hino (JP); Hideyuki Matsuoka, Nishitokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/037,090

(22) Filed: Jan. 19, 2005

(65) Prior Publication Data

US 2005/0128835 A1    Jun. 16, 2005

Related U.S. Application Data

(63) Continuation of application No. 10/373,959, filed on Feb. 27, 2003, now Pat. No. 6,862,235.

(30) Foreign Application Priority Data

Aug. 27, 2002 (JP) .............................. 2002-246092

(51) Int. Cl.[7] ................................................ G11C 7/00
(52) U.S. Cl. ............. 365/202; 365/230.06; 365/189.05
(58) Field of Search .......................... 365/202, 230.06, 365/189.05

(56) References Cited

U.S. PATENT DOCUMENTS

| | | | | |
|---|---|---|---|---|
| 5,793,685 A | * | 8/1998 | Suma | ......................... 365/201 |
| 5,954,435 A | * | 9/1999 | Yoshida | ...................... 365/200 |
| 6,094,368 A | | 7/2000 | Ching | |
| 6,209,113 B1 | | 3/2001 | Roohparvar | |
| 6,272,066 B1 | * | 8/2001 | Ooishi | ................... 365/230.08 |
| 6,275,084 B1 | | 8/2001 | McAdams | |

FOREIGN PATENT DOCUMENTS

| | | |
|---|---|---|
| JP | 7-220479 | 2/1994 |
| JP | 9-63286 | 8/1995 |
| JP | 2002-93158 | 9/2000 |

OTHER PUBLICATIONS

Roy Scheuerlein, William Gallagher, Stuart Parkin, Alex Lee, Sam Ray, Ray Robertazzi and WilliamReohr, "A 10ns Read and Write Non-Volatile Memory Array Using a Magnetic Tunnel Junction and FET Switch in Each Cell", 2000 IEEE International Solid-State Circuits Conference, 1 page.

(Continued)

Primary Examiner—Anh Phung
Assistant Examiner—Tuan T. Nguyen
(74) Attorney, Agent, or Firm—Reed Smith LLP; Stanley P. Fisher, Esq.; Juan Carlos A. Marquez, Esq.

(57) ABSTRACT

A write operation of a MRAM in which a current necessary for inverting magnetization of an MTJ element has to be passed through a data line and therefore current consumption is large. The write operation comprises: comparing input data DI with read data GO read from a memory cell array and encoding the input data DI to form write data GI by a data encoder WC; and decoding the read data GO by a data decoder RD to form output data DO. In a nonvolatile semiconductor memory in which the current is passed through the data line to write data into a memory cell, the number of bits to be written during the write operation is reduced, and the current consumption can be reduced. This can realize the MRAM including a low-power highly-integrated memory.

7 Claims, 16 Drawing Sheets

OTHER PUBLICATIONS

Manzur Gill, Tyler Lowrey and John Park, "Ovonic Unified Memory—A High-Performance Nonvolatile Memory Technology for Stand-Alone Memory and Embedded Applications", ISSCC 2002/Feb. 5, 2002/Session 12/TD: Digital Directions/12.4, 2 pages.

Mircea R. Stan and Wayne P. Burleson, "Bus-Invert Coding for Low-Power I/O", IEEE Transactions on Very Large-Scale Integration (VLSI) Systems, vol. 3, No. 1, Mar. 1995, pp. 49-58.

M. Durlam, P. Naji, A. Omair, M.DeHerrera, J. Calder, J.M. Slaughter, B. Engel, N. Rizzo, G. Grynkewich, B. Butcher, C. Tracy, K. Smith, K. Kyler, J. Ren, J. Molia, B. Feil, R. Williams, and S. Tehrani, "A Low Power 1Mbit MRAM Based on 1T1MTJ Bit Cell Integrated with Copper Interconnects", IEEE 2002 Symposium on VLSI Circuits Digest of Technical Papers, pp. 158-161.

* cited by examiner

SEMICONDUCTOR DEVICE WHICH IS LOW IN POWER AND HIGH IN SPEED AND IS HIGHLY INTEGRATED

This application is a Continuation application of nonprovisional U.S. Ser. No. 10/373,959 filed on Feb. 27, 2003 now U.S. Pat. No. 6,862,235, issued on Mar. 1, 2005. Priority is claimed based upon U.S. Application No. 10/373,959 filed on Feb. 27, 2003, which claims the priority of Japanese Patent Application 2002-246092 filed on Aug. 27, 2002.

BACKGROUND OF THE INVENTION

1. Field of the Invention

The present invention relates to a semiconductor device, particularly to a semiconductor device including a nonvolatile memory which uses a memory cell for storing information using a magnetic resistance or phase change resistance and which is low in power and high in speed and is highly integrated.

2. Description of the Related Art

A magnetoresistive random access memory (MRAM) has been developed which is a nonvolatile memory but which has no limitation in the number of read/write operations. The MRAM stores information using a magnetoresistive effect in which a resistance of an element differs with a magnetization direction of a ferromagnetic material in a memory cell. In recent years, development of a magnetic tunnel junction (MTJ) element whose magnetoresistive change ratio referred to as magnetoresistance (MR) is larger than that of a related-art element, and application of the element to the MRAM have been advanced. It has been indicated that a high-speed read/write operation is possible as in a static random access memory (SRAM) and that high integration can be realized as in a dynamic random access memory (DRAM). This is described, for example, in Document 1: 2002 Symposium on VLSI Circuits Digest of Technical Papers, pp. 158–161.

FIG. 11 shows a basic constitution of the memory cell of the MRAM. The cell is constituted of one MTJ element MTJ and one transistor MT, and is connected to a write word line WW, read word line WR, and data line DL. The MTJ element MTJ includes a structure of a tunnel insulating film held between a fixed layer of a ferromagnetic material whose magnetization direction is fixed in a usual operation, and a free layer of the ferromagnetic material whose magnetization direction can be reversed by a write operation. A resistance between two terminals of the MTJ element changes by the direction of magnetization in two ferromagnetic material layers. When the directions are the same, a low resistance state is obtained. When the directions are opposite to each other, a high resistance state is obtained.

A read operation is performed as shown in FIG. 12. That is, the operation comprises: selecting the read word line WR; achieving electric continuity of a transistor MMC; applying a voltage between the terminals of the MTJ element MTJ; detecting a current IDL flowing in accordance with the magnetoresistance of the MTJ element MTJ via the data line DL; and reading out stored information. On the other hand, a write operation is performed as shown in FIG. 13. That is, the operation comprises: setting a current IWW of the selected write word line WW to a write word line current IWS; and passing a write current ID1 or ID0 through the data line DL in accordance with writing data. At this time, a magnetoresistive change MR which is a ratio of a resistance increase of the high resistance state to the low resistance state of the MTJ element indicates a hysteresis characteristic shown in FIG. 14. The magnetization reverse of the MTJ element easily occurs by a hard axis magnetic field generated in the write word line current IWS, and the hysteresis characteristic becomes narrow with respect to the data line current IDL which causes an easy axis magnetic field. Thereby, only the selected memory cell is reversed in magnetization by the write word line WW and the stored information can be written. It is to be noted that in FIGS. 12 to 14, the low resistance state of the MTJ element is represented by '1', and the high resistance state is represented by '0', but this representation may be reverse.

In the same manner as in the MRAM, a phase change memory has also been developed to aim at the nonvolatile memory which has high-speed and is highly integrated. This is described, for example, in Document 2: 2002 IEEE International Solid-State Circuits Conference, Digest of Technical Papers, pp. 202–203. The phase change memory uses a resistance which differs by a state of a phase change material to store the information. A phase change resistance is rewritten by passing the current to generate heat.

The present inventors have studied a current consumption in the write operation with the highly integrated MRAM prior to the present application. At present, the write word line current IWS and write current ID1 or ID0 shown in FIG. 13 require a magnitude of about 2 mA to 8 mA in order to generate a sufficiently large magnetic field. In Document 1, a technique referred to as cladding has been proposed for concentrating the magnetic field generated by the word and data lines on an MTJ element side, but a current of about 4 mA is used. Additionally, when the number of bits to be written at the same time increases, the write current is passed through the same number of data lines as that of bits. The present inventors have found that a total write current increases. Moreover, the present inventors have found that with a reduced area of the ferromagnetic material, the magnetic field necessary for the magnetization reverse is generally enlarged, and a further large current is required.

Furthermore, the phase change memory also has a large current required for the writing, because a sufficient temperature rise is caused in the phase change resistance. Additionally, the same current path is used for the reading/writing, and the read current has to be set to be different from the write current at a desired ratio in order to prevent disturbance by the reading. Therefore, the present inventors have found that to enlarge the read current for a high-speed read operation, the write current also has to be enlarged.

SUMMARY OF THE INVENTION

An object of the present invention is to realize a high-speed nonvolatile memory which has a small current consumption and low power at a write time and which is highly integrated.

To achieve the above-described object, according to the present invention, there is provided one of representative means as follows. That is, there is provided a nonvolatile semiconductor memory in which a current is passed through a data line to write data in a memory cell. In the memory, the data is read from the selected memory cell during a write operation, and inverting/writing is performed only with respect to a bit which disagrees with input data inputted from the outside. More preferably, the memory includes: an encoder for encoding the data of a plurality of selected memory cells so as to reduce the number of data to be inverted and forming write data of the plurality of memory cells; and a decoder for decoding the data read from the plurality of selected memory cells and forming output data to be outputted to the outside.

Other objects, features and advantages of the invention will become apparent from the following description of the embodiments of the invention taken in conjunction with the accompanying drawings.

DESCRIPTION OF THE EMBODIMENT

Figure 1:
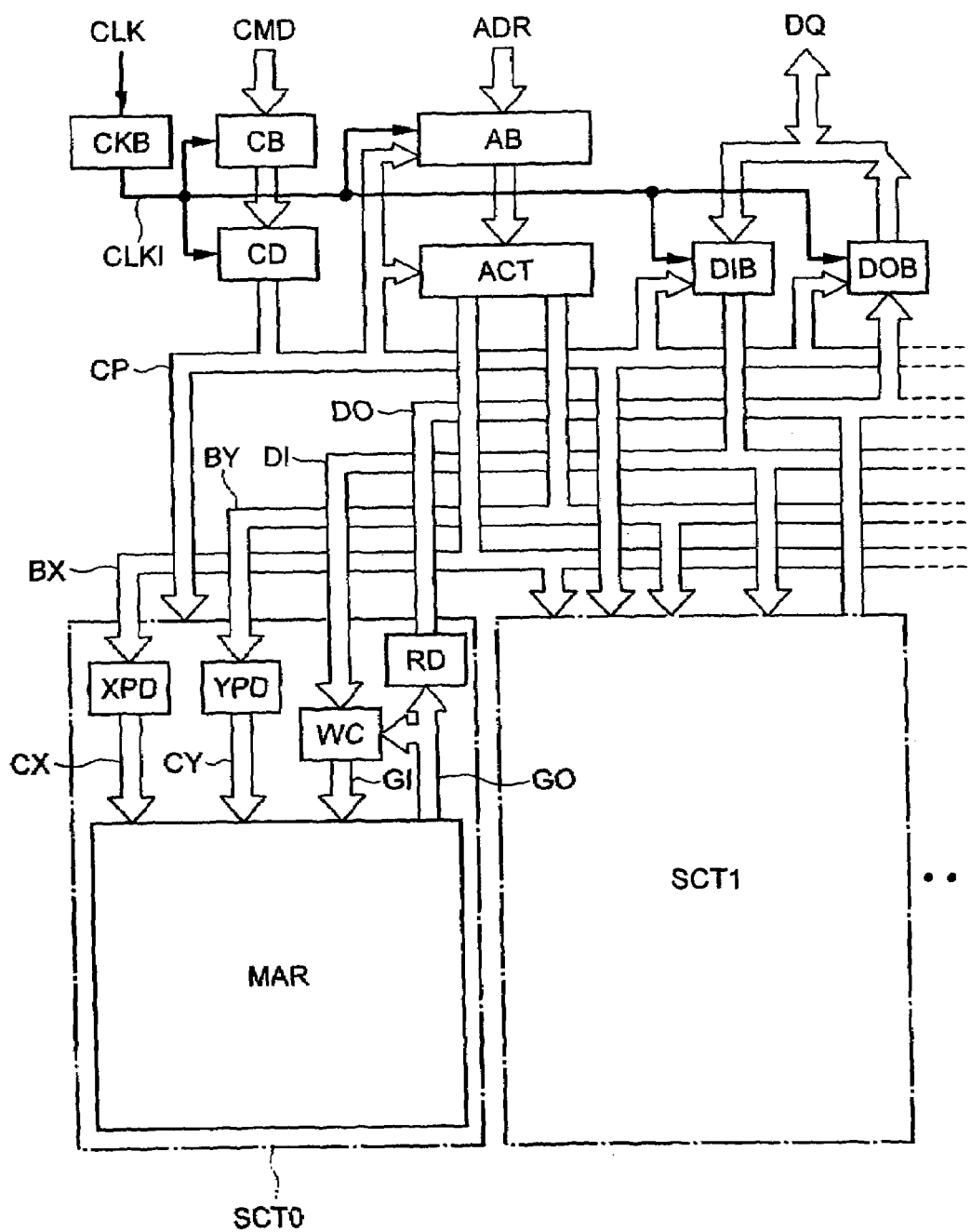
FIG. 1 is a block diagram showing a constitution example of a synchronous memory according to the present invention.

Embodiments of the present invention will be described hereinafter with reference to the drawings. A circuit element constituting each function block of the embodiment is not especially limited. However, the circuit element is formed on a semiconductor substrate such as monocrystal silicon by an integrated circuit technique of a known complementary MOS (CMOS) transistor. In the drawings, the body of a PMOS transistor is denoted with an arrow symbol and thereby distinguished from a NMOS transistor. In the drawings, the connection of a substrate potential of a MOS transistor is not especially clearly shown. However, the connection method is not especially limited, as long as the MOS transistor is in a normally operable range. Moreover, a low level of a signal is denoted with '0', and a high level is denoted with '1', unless otherwise described.

First Embodiment

FIG. 1 is a main part block diagram of a memory according to the present invention. A first embodiment is characterized in that a data encoder WC and data decoder RD are disposed. Here, the constitution example of a synchronous memory is shown. The example includes a clock buffer CKB, command buffer CB, command decoder CD, address buffer AB, address counter ACT, input buffer DIB, and output buffer DOB. Furthermore, sectors SCT0, SCT1, ... including memory arrays MAR are disposed. The sector is disposed for each bank, but the bank may include a plurality of sectors. The sector further includes a row pre-decoder XPD, column pre-decoder YPD, data encoder WC, and data decoder RD.

Each circuit block has the following function. The clock buffer CKB distributes an external clock CLK as an internal clock CLK1 to the command decoder CD. The command decoder CD generates a control signal CP for controlling the address buffer AB, column address counter YCT, input buffer DIB, and output buffer DOB in response to a control signal CMD taken from the outside by the command buffer CB. The address buffer AB takes in an address ADR from the outside and sends the address to the address counter ACT at a desired timing in response to the external clock CLK. The address counter ACT uses the address as an initial value to generate the address for performing a burst operation, sends a row address BX to a row address pre-decoder XPD, and sends a column address BY to a column address pre-decoder YPD. The row address pre-decoder XPD pre-decodes the row address BX, and outputs a row pre-decode address CX to the memory array MAR. The column address pre-decoder YPD pre-decodes the column address and outputs a column pre-decode address CY to the memory array MAR. The input buffer DIB takes in the data of input/output data DQ with respect to the outside at a desired timing. The data encoder WC compares input data DI with read data GO from the memory array MAR to encode the input data, and outputs write data GI to the memory array MAR. On the other hand, the data decoder RD decodes the read data GO, and sends output data DO to the output buffer DOB. The output buffer DOB outputs the output data DO to the input/output data DQ at the desired timing.

Here, the memory array MAR is constituted of arrangement of memory cells including the MTJ element and transistor as described later. Moreover, the data encoder WC and data decoder RD form the data to be written in the memory array MAR in a code whose number of bits to be inverted is reduced with respect to the usual binary input/output data DQ. This coding is called a bus-invert coding, and is similar to the coding described in Document 3: IEEE Transactions on very large Scale Integration (VLSI) Systems, Vol. 3, No. 1, pp. 49–58, March 1995. In Document 3, the maximum value of the number of bits to be inverted can be reduced by half with respect to the data of the bus between chips by the bus invert coding. This coding can be used to reduce the maximum value of the number of memory cells to be inverted/written in the memory array MAR by half. Thereby, the maximum value of a total current consumption of the memory array MAR at a write time can be reduced. Moreover, the average value of the current consumption is also reduced.

The data encoder WC is disposed for each sector. Thereby, when the data is encoded, a path for transmitting the read data GO read from the memory array MAR to the data encoder WC is shortened. Thereby, a delay time and power consumption are reduced with the transmission of the read data GO. Here, the data decoder RD is also disposed for each sector in accordance with the data encoder WC.

The constitution and operation of the data encoder WC and data decoder RD will be described hereinafter. In the following, a case will be described in which the data encoder WC encodes the binary input data DI of eight bits into the write data GI of nine bits by adding one bit as a flag. Conversely, the data decoder RD decodes the read data GO of nine bits to the output data DO of eight bits by removing the flag. Here, the binary input data DI of eight bits is transmitted by complementary signals DI0$t$ to DI7$t$, DI0$b$ to DI7$b$. Moreover, the write data GI of nine bits is also transmitted by complementary signals GI0$t$ to GI8$t$, GI0$b$ to GI8$b$. Similarly, the read data GO of nine bits is transmitted by complementary signals GO0$t$ to GO8$t$, GO0$b$ to GO8$b$. On the other hand, the output data DO of eight bits is transmitted by true signals DO0 to D07. Of course, the present invention is not limited to the data transmission method or the number of bits, and can also be applied to another number of bits. However, when the number of bits is large, circuit scales of the data encoder WC and data decoder RD are enlarged. When the number of bits is small, the number of memory cells increases by the flag. Therefore, the coding of eight bits to nine bits is appropriate. With a memory constituted of 16 bits, the constitution is divided into upper eight bits and lower eight bits, and the bits are preferably coded, respectively.

Figure 2:
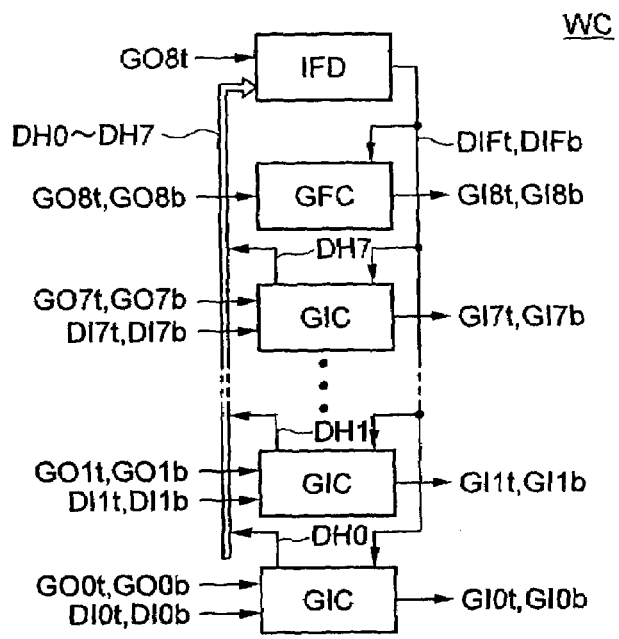
FIG. 2 is a block diagram showing the constitution example of a data encoder.

FIG. 2 shows the constitution example of the data encoder WC. The encoder is constituted of eight data control circuits GIC corresponding to eight-bit input data DI0$t$ to DI7$t$, DI0$b$ to DI7$b$, flag control circuit GFC, and judgment circuit IFD. The data control circuits GIC compare the input data DI0$t$ to DI7$t$, DI0$b$ to DI7$b$ with the read data GO0$t$ to GO7$t$, GO0$b$ to GO7$b$, are controlled by control signals DIFt, DIFb outputted by the judgment circuit IFD, and output write data GI0$t$ to GI7$t$, GI0$b$ to GI7$b$. The flag control circuit GFC receives the read data GO8$t$, GO8$b$ of the flag, is controlled by control signals DIFt, DIFb, and outputs write data GI8$t$, GI8$b$ of the flag. The judgment circuit IFD outputs the control signals DIFt, DIFb in accordance with data comparison results DH0 to DH7 of eight data control circuits GIC and read data GO8$t$ of the flag. The control signals DIFt, DIFb indicate whether or not to invert the data. When the data is inverted, DIFt turns to '0' and DIFb turns to '1'.

Figure 3:
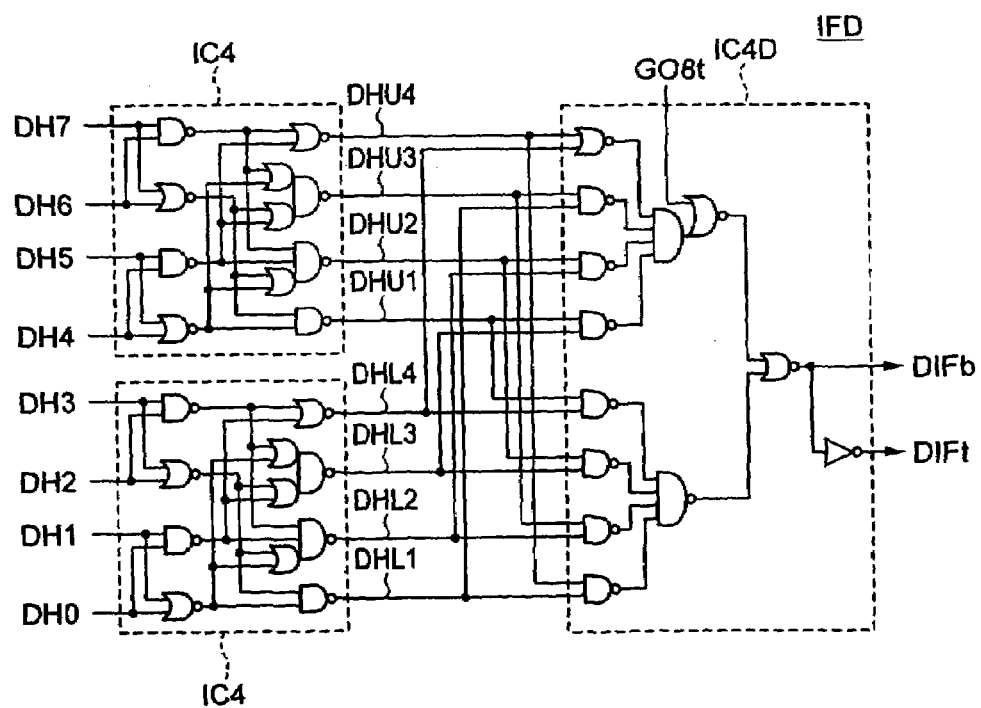
FIG. 3 is a circuit diagram showing the constitution example of a judgment circuit in FIG. 2.

FIG. 3 shows the constitution example of the judgment circuit IFD in FIG. 2. This circuit judges whether or not there are five or more '1' with respect to nine inputs including the data comparison results DH0 to DH7 and the read data GO8$t$ of the flag. The circuit includes two logic circuits IC4 and logic circuit IC4D. The logic circuit IC4 is constituted of three 2-input NAND gates, three 2-input NOR gates, 4-input composite gate taking 2-input OR to take NAND, and composite gate taking 2-input OR to take NAND with two other inputs. This logic circuit IC4 obtains outputs in accordance with the number of '1' in four inputs. For example, outputs DHL1 to DHL4 of the logic circuit IC4 to which the data comparison results DH0 to DH3 are inputted are as follows. When any one of DH0 to DH3 indicates '1', and the number of '1' is one or more, DHL1 turns to '1'. When there are two or more '1' in DH0 to DH3, DHL2 turns to '1'. When there are three or more '1' in DH0 to DH3, DHL3 turns to '1'. When all of DH0 to DH3 are '1', and there are four '1', DHL4 turns to '1'. The above-described outputs DHL1 to DHL4 and DHU1 to DHU4 of the logic circuits IC4, and read data GO8$t$ are inputted into the logic circuit IC4D. The logic circuit IC4D is constituted of two 2-input NOR gates, seven 2-input NAND gates, composite gate taking 4-input OR to take NAND with other inputs, 4-input NAND gate, and inverter. By this logic circuit IC4D, when there are five or more '1' with respect to nine inputs including the data comparison results DH0 to DH7 and the read data GO8$t$ of the flag, the judgment result DIFt turns to '1', and DIFb turns to '0'.

This judgment circuit is constituted of a static CMOS logic gate, and does not use a signal for controlling the timing. Therefore, the delay of the write data by the coding can be reduced. In this judgment circuit, with the use of the composite gate, the number of gates is decreased, the delay time is shortened, and the circuit scale is reduced. The judgment circuit can also be constituted using a multi-input differential amplifier, not the CMOS logic gate. In this case, as compared with the judgment circuit shown in FIG. 3, devices for securing S/N such as setting of an operation timing are necessary, but the number of elements can be reduced.

Figure 4:
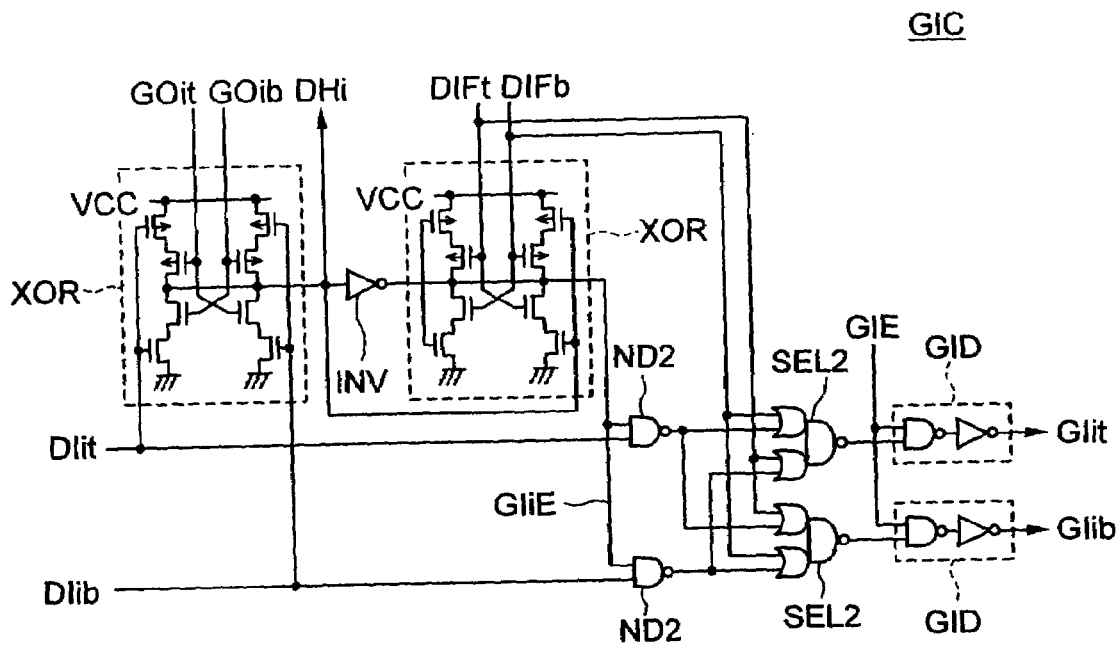
FIG. 4 is a circuit diagram showing the constitution example of a data control circuit in FIG. 2.

FIG. 4 shows the constitution example of the data control circuit GIC in FIG. 2. In the drawing, i in a symbol corresponds to any one of 0 to 7 in FIG. 2. The circuit is constituted of: two logic gates XOR including four PMOS transistors and four NMOS transistors; inverter INV; two 2-input NAND gates ND2; two 4-input composite gates ONA2 taking 2-input OR to take NAND; and two write data drivers GID including 2-input NAND gate and inverter. The write data drivers GID are controlled by an enable signal GIE to output write data GIi$t$, GIi$b$. The logic gate XOR takes an exclusive NOR of the input data DIi$t$, DIi$b$ of the complementary signal and read data GOi$t$, GOi$b$, and outputs the data comparison result DHi. Moreover, the inverter INV and logic gate XOR take an exclusive OR of the data comparison result DHi and judgment results DIFt, DIFb of the complementary signal, and generate a control signal GIiE. This control signal GIiE indicates whether or not inverting/writing is required. When the control signal GIiE is '0', both the write data GIi$t$, GIi$b$ are '0'. When the control signal GIiE is '1', the control signal DIFt is '0', and DIFb is '1', the true and bar signals of the input data DIi$t$, DIi$b$ are changed and outputted as the write data GIi$t$, GIi$b$. When DIFt is '1', and DIFb is '0', the input data DIi$t$, DIi$b$ are outputted as the write data GIi$t$, GIi$b$. In this constitution, since the composite gate is used, a desired logic is realized by a small number of gate stages. Especially, since the input data DIi$t$, DIi$b$ and read data GOi$t$, GOi$b$ and the judgment results DIFt, DIFb are formed into the complementary signals, the exclusive NOR and OR are constituted by one stage of gates, and the reduction of delay time is decreased.

Figure 5:
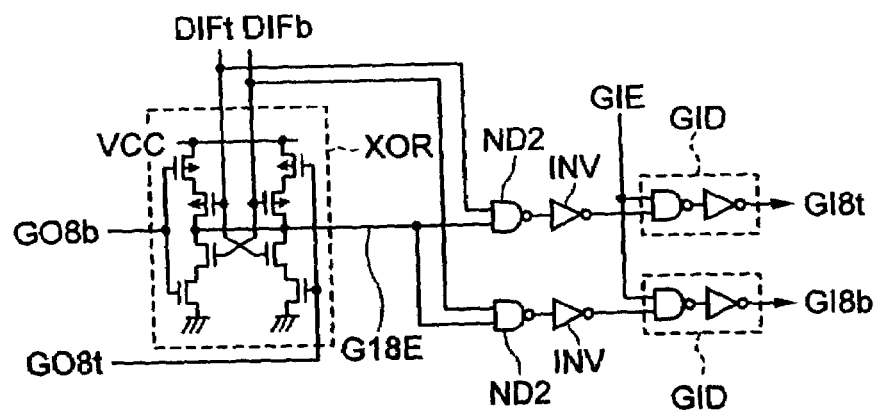
FIG. 5 is a circuit diagram showing the constitution example of a flag control circuit in FIG. 2.

FIG. 5 shows the constitution example of the flag control circuit GFC in FIG. 2. The circuit is constituted of: the logic gate XOR including four PMOS transistors and four NMOS transistors; two 2-input NAND gates ND2; two inverters INV; and two write data drivers GID including the 2-input NAND gate and inverter. In the same manner as in the data control circuit GIC of FIG. 4, the write data drivers GID are controlled by the enable signal GIE to output the write data GI8$t$, GI8$b$. The logic gate XOR takes the exclusive NOR of the read data GO8$t$, GO8$b$ of the flag of the complementary signal and judgment results DIFt, DIFb to generate a control signal GI8E. The control signal GI8E is a signal indicating whether or not the inverting/writing is necessary in the same manner as in the control signal GIiE in FIG. 4. When the control signal GI8E indicates '0', both the write data GI8t, GI8b are set to '0'. When the control signal GI8E indicates '1', the judgment results DIFt, DIFb are outputted as the write data GI8t, GI8b. The path for outputting the write data GI8t, GI8b with respect to the judgment results DIFt, DIFb has the same number of stages as that of the path for outputting the write data GIit, GIib by the data control circuit GIC of FIG. 4, and the delay times are substantially matched.

Figure 6:
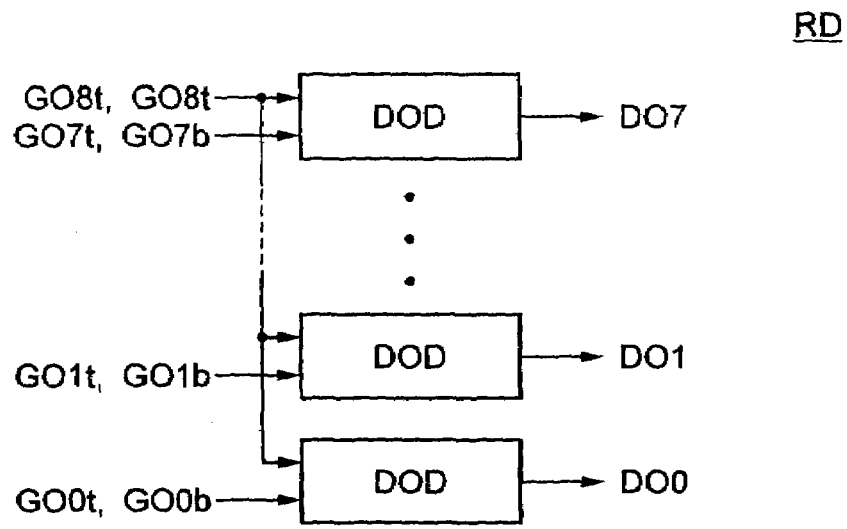
FIG. 6 is a block diagram showing the constitution example of a data decoder.

FIG. 6 shows the constitution example of the data decoder RD. The decoder is disposed for the output data DO0 to DO7 of eight bits, and is constituted of eight data control circuits DOD controlled by the read data GO8t, GO8b of the flag. It is to be noted that when a load capacity is excessively enlarged by the input into eight data control circuits DOD with respect to the read data GO8t, GO8b of the flag, a buffer may be disposed by the even number of stages of inverter rows.

Figure 7:
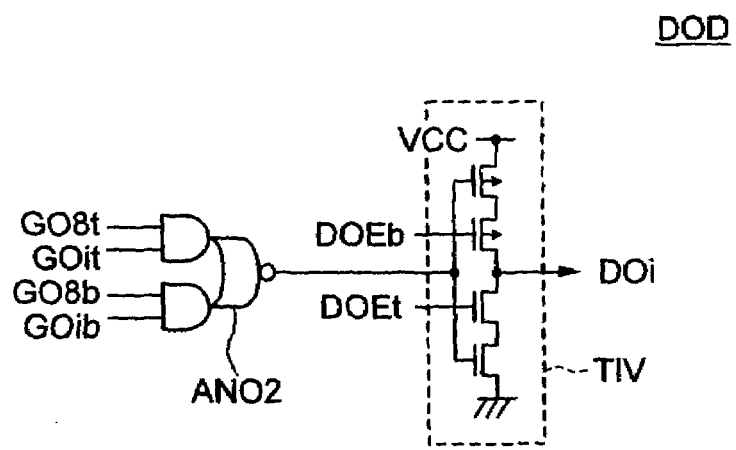
FIG. 7 is a circuit diagram showing the constitution example of the data control circuit in FIG. 6.

FIG. 7 shows the constitution example of the data control circuit DOD in FIG. 6. In the drawing, i in the symbol corresponds to any one of 0 to 7 in FIG. 6. The circuit is constituted of: a 4-input composite gate ANO2 taking 2-input AND to take NOR; and a tri-state inverter TIV including two PMOS transistors and two NMOS transistors. The 4-input composite gate ANO2 selects the read data GOit or GOib by the read data GO8t, GO8b of the flag which are complementary signals. The tri-state inverter TIV outputs output data DOi, when an enable signal DOEb is low and DOEt is high. The tri-state inverter is used in this manner, because the output data DOi is bus driven from a plurality of sectors SCT0, SCT1, . . . as shown in FIG. 1. In this manner, the encode of the read data can be realized with a simple circuit constitution. The delay time is short, and influence of read onto access time is small.

Figure 8:
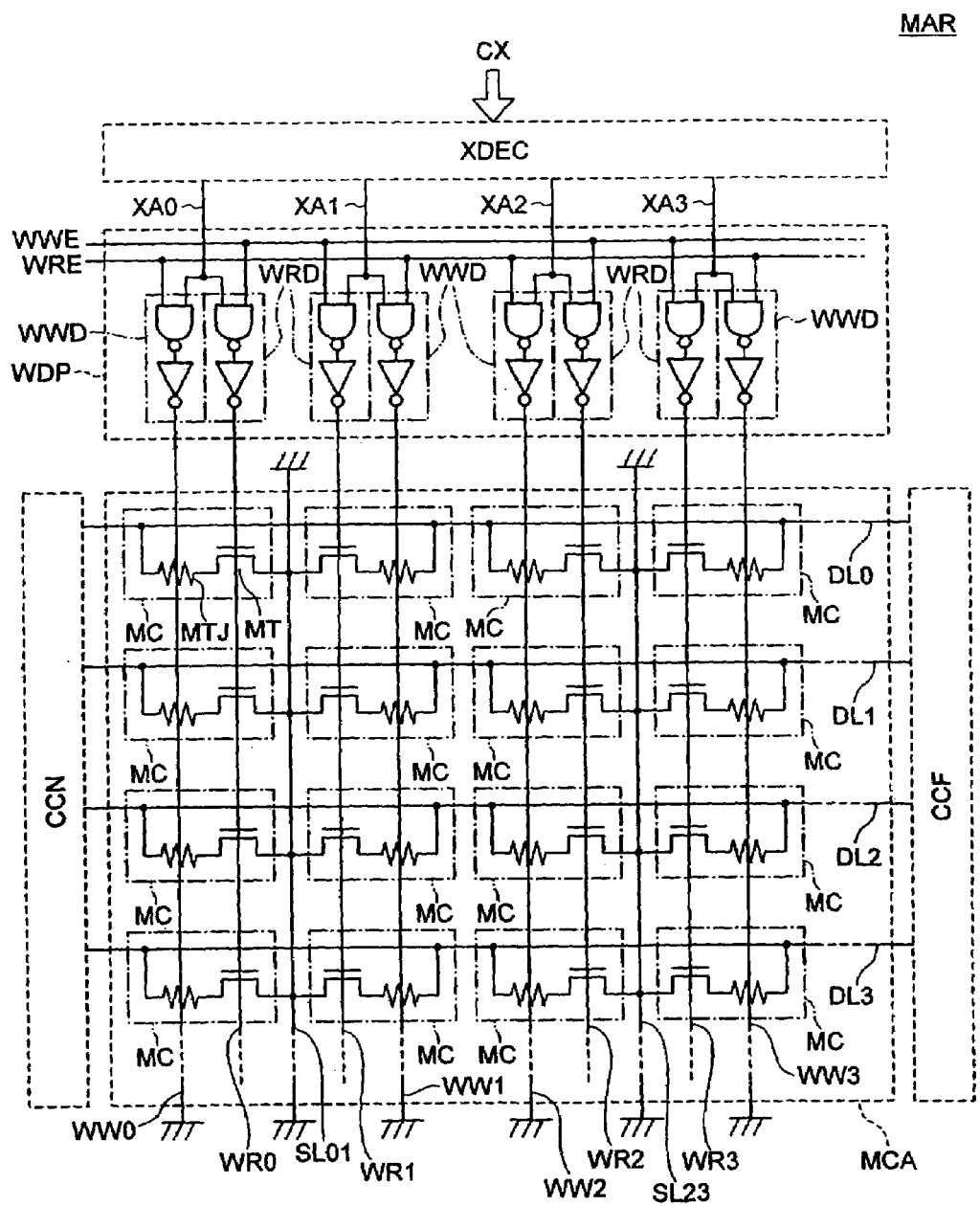
FIG. 8 is a diagram showing the constitution example of a memory array of a MRAM.

FIG. 8 shows the constitution example of the memory array MAR in FIG. 1. The array includes a memory cell array MCA, row decoder XDEC, word driver group WDP, and data line control circuits CCN, CCF. Here, for the sake of simplicity, dummy cells for generating reference signals are omitted. Moreover, this constitution may be repeated to form the memory array MAR of FIG. 1 depending on a memory capacity. In the memory cell array MCA, memory cells MC are disposed in intersections of write word lines WW0, WW1, WW2, WW3, . . . and read word lines WR0, WR1, WR2, WR3, . . . with data lines DL0, DL1, DL2, DL3, . . . The memory cells MC are also connected to source lines SL01, SL23, . . . whose opposite ends are grounded. The write word lines WW0, WW1, WW2, WW3, . . . and read word lines WR0, WR1, WR2, WR3, . . . are controlled by the word driver group WDP including the driving circuit. The opposite ends of the data lines DL0, DL1, DL2, DL3, . . . are controlled by the data line control circuits CCN, CCF including a sense amplifier and write buffer.

Figure 12:
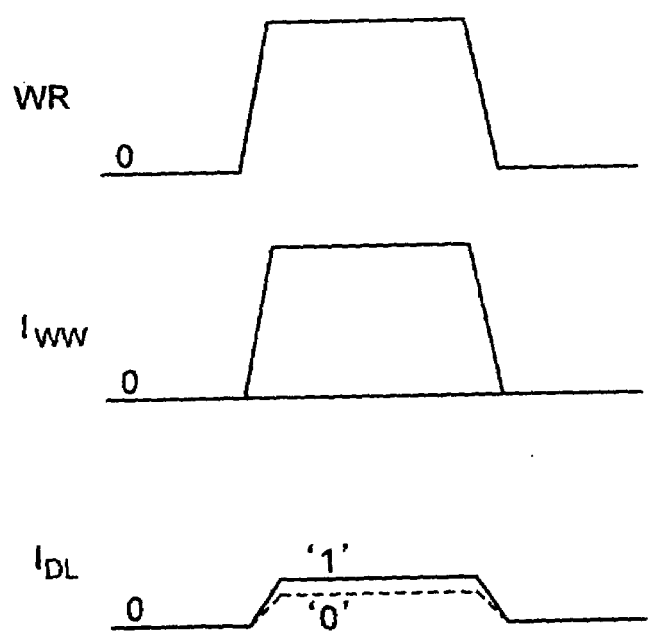
FIG. 12 is a diagram showing a read operation of the MRAM cell.
Figure 13:
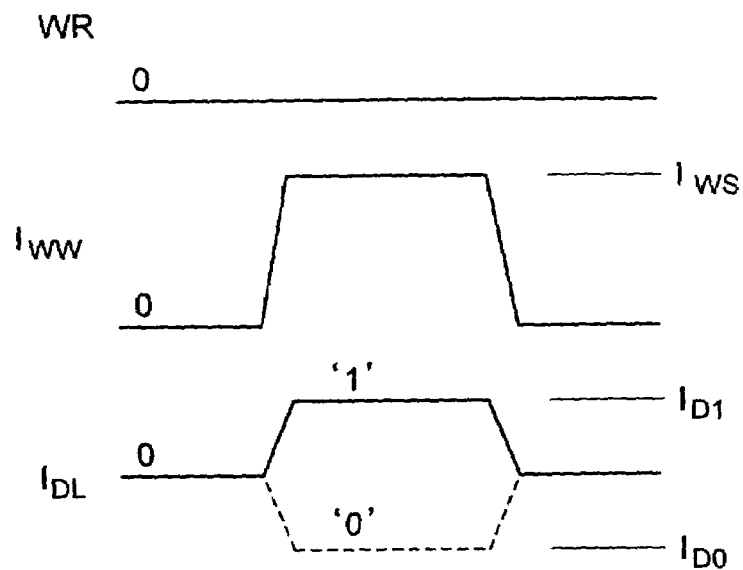
FIG. 13 is a diagram showing a write operation of the MRAM cell.
Figure 14:
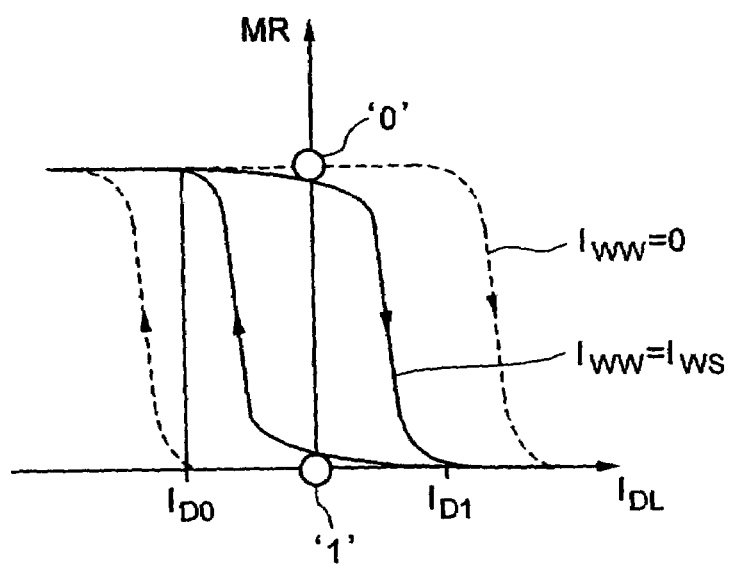
FIG. 14 is a diagram showing write characteristics of an MTJ element.

Each memory cell MC includes one MTJ element MTJ and one transistor MT. The MTJ element MTJ includes a structure of a tunnel insulating film held between a fixed layer of a ferromagnetic material whose magnetization direction is fixed in a usual operation, and a free layer of the ferromagnetic material whose magnetization direction can be reversed by the write operation. The resistance between two terminals of the MTJ element changes by the direction of magnetization in two ferromagnetic material layers. When the directions are the same, a low resistance state is obtained. When the directions are opposite to each other, a high resistance state is obtained. The read operation of the memory cell MC is performed as shown in FIG. 12. That is, the operation comprises: setting the read word line WR selected from WR0, WR1, WR2, WR3, . . . to a high level; achieving electric continuity of the transistor MT in the memory cell connected to the word line to apply a voltage between the terminals of the MTJ element MTJ; detecting a current IDL flowing via a desired data line in DL0, DL1, DL2, DL3, . . . in accordance with the magnetoresistance of the MTJ element MTJ; and reading out stored information. On the other hand, the write operation is performed as shown in FIG. 13. That is, the operation comprises: setting a current IWW of the write word line WW selected in WW0, WW1, WW2, WW3, . . . to a write word line current IWS; and setting the current of the data line selected in DL0, DL1, DL2, DL3, . . . to a positive write current ID1 or a negative ID0 in accordance with the write data to generate a magnetic field.

The row decoder XDEC decodes a row pre-decode address CX, and outputs row decode signals XA0, XA1, XA2, XA3, . . . to the word driver group WDP. The word driver group WDP is constituted of word drivers WWD and WRD each of which includes 2-input NAND gate and inverter and which are disposed for the write word lines WW0, WW1, WW2, WW3, . . . and read word line WR0, WR1, WR2, WR3, . . . The word driver WWD is selected by the row decode signals XA0, XA1, XA2, XA3, . . . to drive any one of the write word lines WW0, WW1, WW2, WW3, . . . , when the enable signal WWE for driving the write word line indicates '1'. The write word lines WW0, WW1, WW2, WW3, . . . are grounded on the side opposite to the word driver group WDP via the array, and a write word line current flows through the selected write word line. The word driver WRD is selected by the row decode signals XA0, XA1, XA2, XA3, . . . to drive any one of the read word lines WR0, WR1, WR2, WR3, . . . , when the enable signal WRE for driving the read word line indicates '1'.

Figure 9:
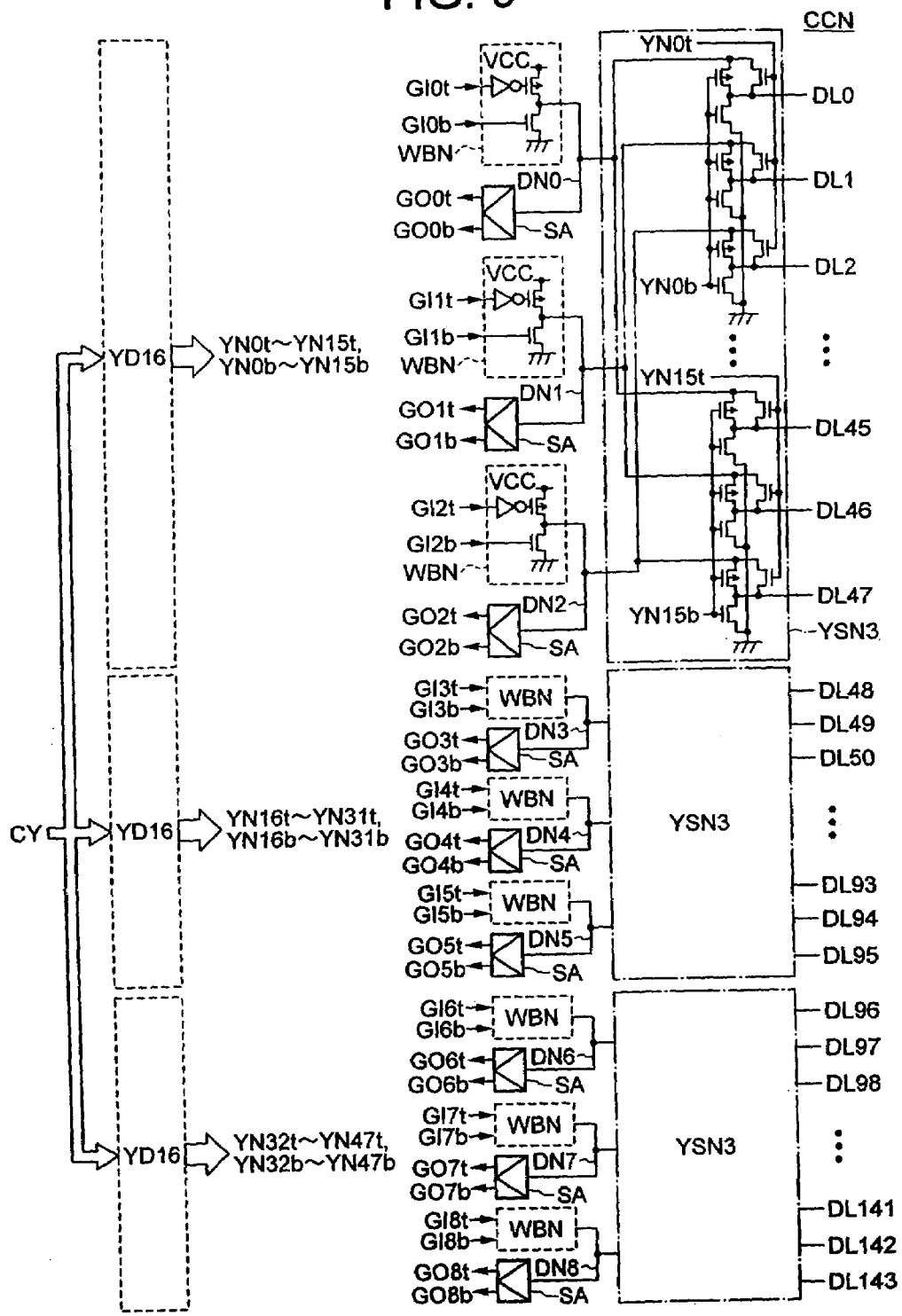
FIG. 9 is a diagram showing the constitution example of a data line control circuit in FIG. 8.

FIG. 9 shows the constitution example of the data line control circuit data CCN in FIG. 8. Here, an example of read or write of nine bits performed with respect to 144 data lines DL0 to DL143 will be described, and the constitution is divided in three every three bits. The circuit includes three column decoders YD 16, nine write buffers WBN, nine sense amplifiers SA, and three column selectors YSN3. The column decoders YD16 decode the column pre-decode address CY, and select one pair from 16 pairs of column selection signals YN0t to YN15t and YN0b to YN15b, YN16t to YN31t and YN16b to YN31b, and YN32t to YN47t and YN32b to YN47b of the complementary signals. The write buffers WBN are constituted of inverters and PMOS and NMOS transistors, receive the write data GI0t to GI8t, GI0b to GI8b, and drive common data lines DN0 to DN8. For example, when the write data GI0t is high, the data line DN0 is driven to be high. When GI0b is low, DN0 is driven to be low. Here, when both the write data GI0t, GI0b are low, a high impedance state is obtained. During the read operation of the memory cell, the sense amplifiers SA detect the signals of the common data lines DN0 to DN8, and output the read data GO0t to GO8t, GO0b to GO8b. In each of the column selectors YSN3, 48 data lines DL0 to DL47, DL48 to DL95, DL96 to DL143 are connected to one PMOS transistor and two NMOS transistors controlled by column selection signals YN0t to YN15t and YN0b to YN15b, YN16t to YN31t and YN16b to YN31b, YN32t to YN47t and YN32b to YN47b. Three of 48 data lines are connected to the common data lines DN0 to DN2, DN3 to DN5, DN6 to DN8. The non-selected data line is kept at a ground voltage VSS. For example, when the column selection signal YN0$t$ is high, and YN0$b$ is low, the data lines DL0 to DL2 are connected to the common data lines DN0 to DN2, and the data lines DL3 to DL47 are kept at VSS.

Figure 10:
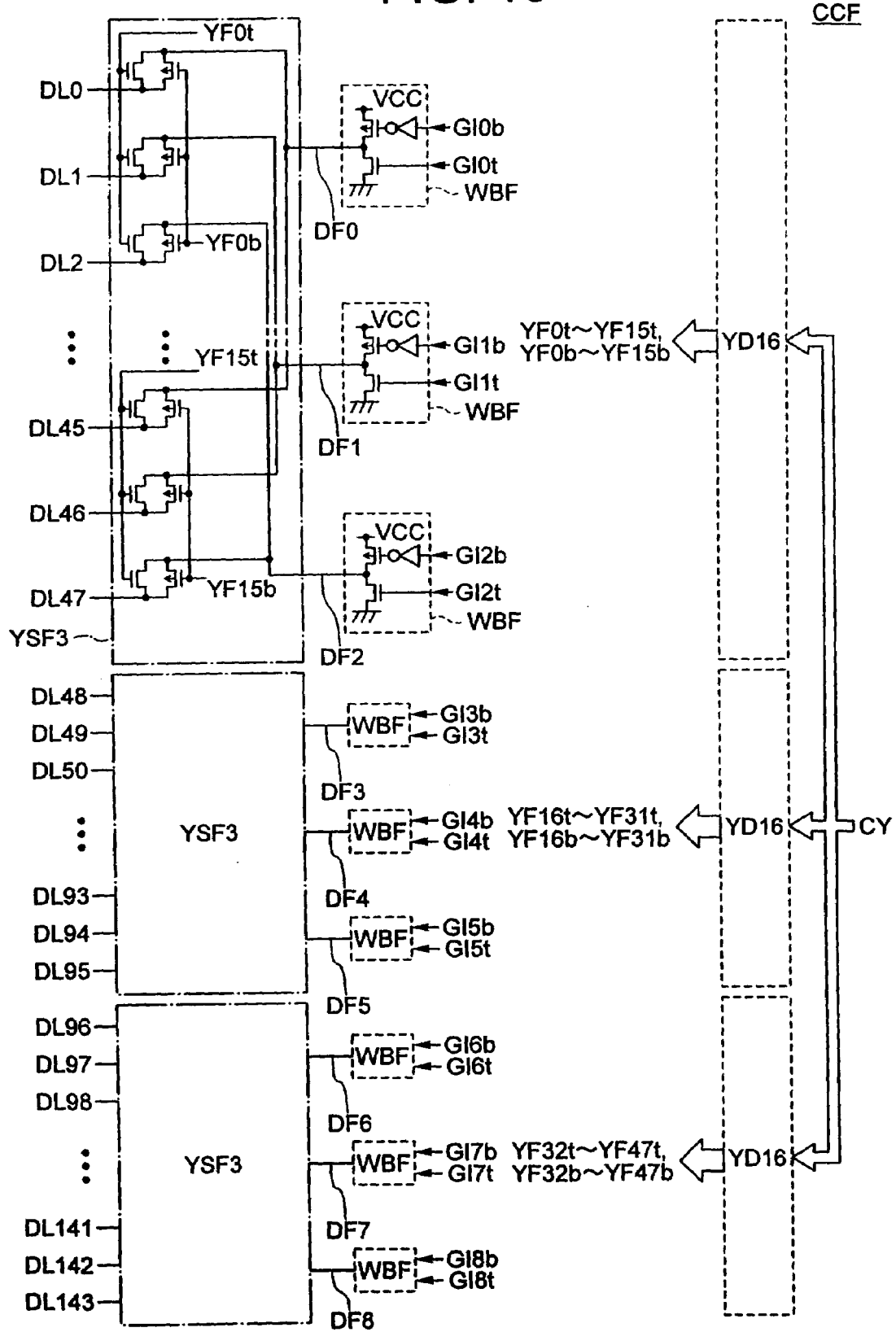
FIG. 10 is a diagram showing the constitution example of the data line control circuit in the other end of FIG. 8.
Figure 11:
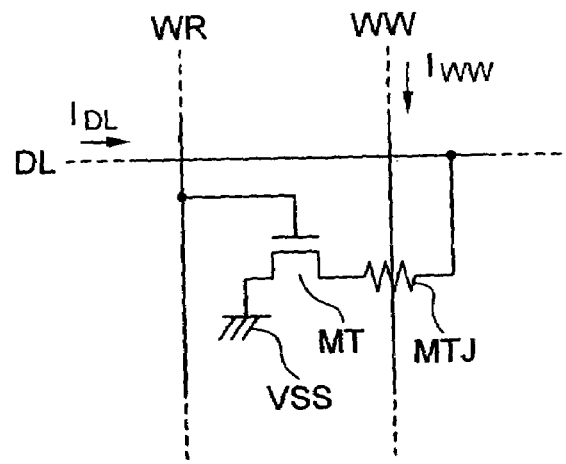
FIG. 11 is a diagram showing the constitution example of a MRAM cell.

FIG. 10 shows the constitution example of the data line control circuit CCF in FIG. 8. The data line control circuit CCN of FIG. 9 contributes to both the read and write, whereas the data line control circuit CCF is used only for the write. The constitution corresponds to the data line control circuit CCN of FIG. 9, an example of write of nine bits performed with respect to 144 data lines DL0 to DL143 will be described, and the constitution is divided in three every three bits. The circuit includes three column decoders YD16, nine write buffers WBF, and three column selectors YSF3. The column decoders YD16 decode the column pre-decode address CY, and selects one pair from 16 pairs of column selection signals YF0$t$ to YF15$t$ and YF0$b$ to YF15$b$, YF16$t$ to YF31$t$ and YF16$b$ to YF31$b$, and YF32$t$ to YF47$t$ and YF32$b$ to YF47$b$ of the complementary signals. In the same manner as in the write buffers WBN of FIG. 9, the write buffers WBF are constituted of the inverters and PMOS and NMOS transistors, receive the write data GI0$t$ to GI8$t$, GI0$b$ to GI8$b$, and drive common data lines DF0 to DF8. Here, the write data GI0$t$ to GI8$t$, GI0$b$ to GI8$b$ are connected in reverse as compared with the write buffers WBN of FIG. 9. For example, when the write data GI0$t$ is high, the common data line DF0 is driven to be low. When GI0$b$ is low, DF0 is driven to be high. When both the write data GI0$t$, GI0$b$ are low, the high impedance state is obtained. In each of the column selectors YSF3, 48 data lines DL0 to DL47, DL48 to DL95, DL96 to DL143 are connected to one PMOS transistor and one NMOS transistor controlled by column selection signals YF0$t$ to YF15$t$ and YF0$b$ to YF15$b$, YF16$t$ to YF31$t$ and YF16$b$ to YF31$b$, YF32$t$ to YF47$t$ and YF32$b$ to YF47$b$. Three of 48 data lines are connected to the common data lines DF0 to DF2, DF3 to DF5, DF6 to DF8. For example, when the column selection signal YF0$t$ is high, and YF0$b$ is low, the data lines DL0 to DL2 are connected to the common data lines DF0 to DF2.

With the write buffers WBN, WBF constituted in this manner, when the signals of the write data are both low, both the write buffers have high impedance states, and the data line can be controlled not to pass the current. That is, an unnecessary write current can be prevented.

When the data is coded as in the present embodiment, and when the flag is added, the number of memory cells selected at the same time is not an exponential of 2. When eight bits are coded to nine bits, the data line control circuits CCN, CCF are constituted in this manner, and each circuit is divided into there every three bits. In this case, the data path can be aligned, and it becomes easy to control the timings of the sense amplifiers.

Figure 15:
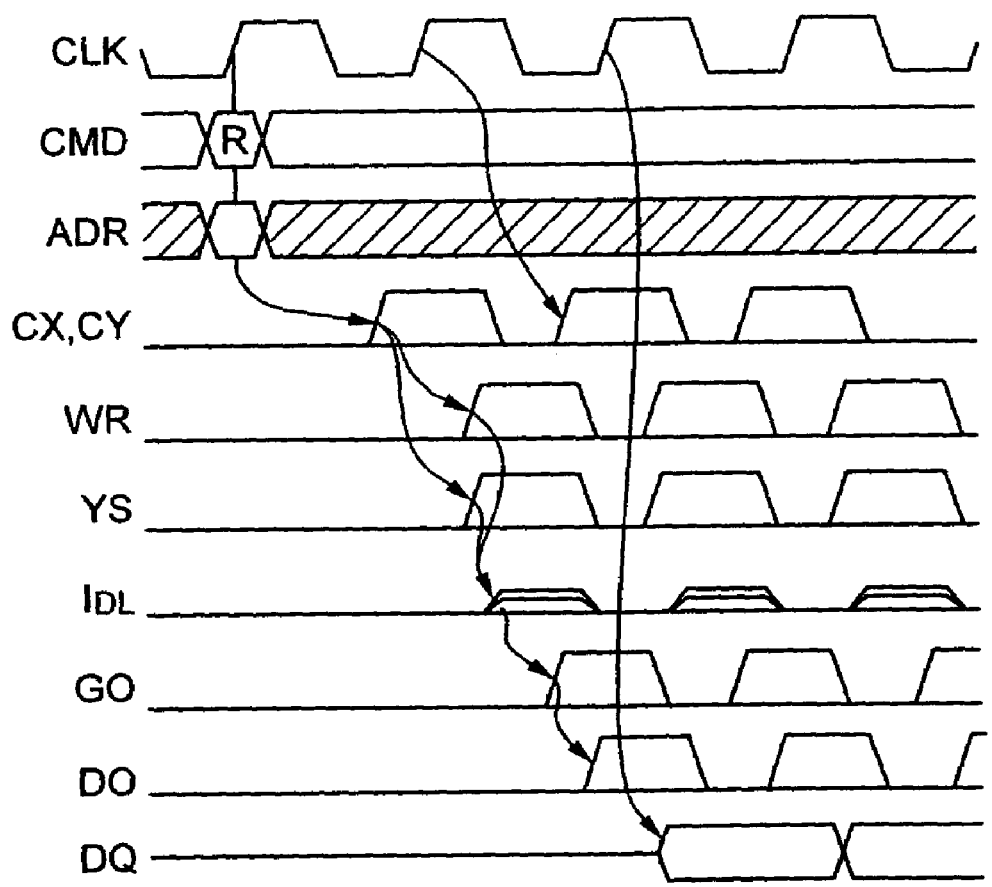
FIG. 15 is a timing chart of a read operation of a synchronous MRAM according to the present invention.

FIG. 15 shows an example of the timing of the read operation of the synchronous MRAM described above. The operation will be described with reference to this timing chart. Every time the external clock CLK rises, the command decoder CD judges the control signal CMD. When a read command R is given, the row and column addresses are taken into the address buffer AB from the address ADR. The column address taken from the address buffer AB is used as an initial value to operate the address counter ACT every clock cycle, and the row address BX and column address BY are outputted. On receiving the addresses, the row address pre-decoder XPD outputs the row pre-decode address CX, and the column address pre-decoder YPD outputs the column pre-decode address CX. In the memory array MAR, the read word line WR and column selection signal YS are selected. Thereby, the data line current IDL flows through the selected data line. This is detected by the sense amplifiers SA to output the read data GO. The data decoder RD decodes the read data GO, and sends the output data DO to the output buffer DOB. Furthermore, the output buffer DOB outputs the data to the input/output data DQ at a timing in response to the external clock CLK. Here, with respect to the read command R, the data is outputted to the input/output data DQ in response to the rising of the clock CLK after two cycles. This indicates a read latency of 3. The above-described operation is repeated every cycle of the clock CLK.

Figure 16:
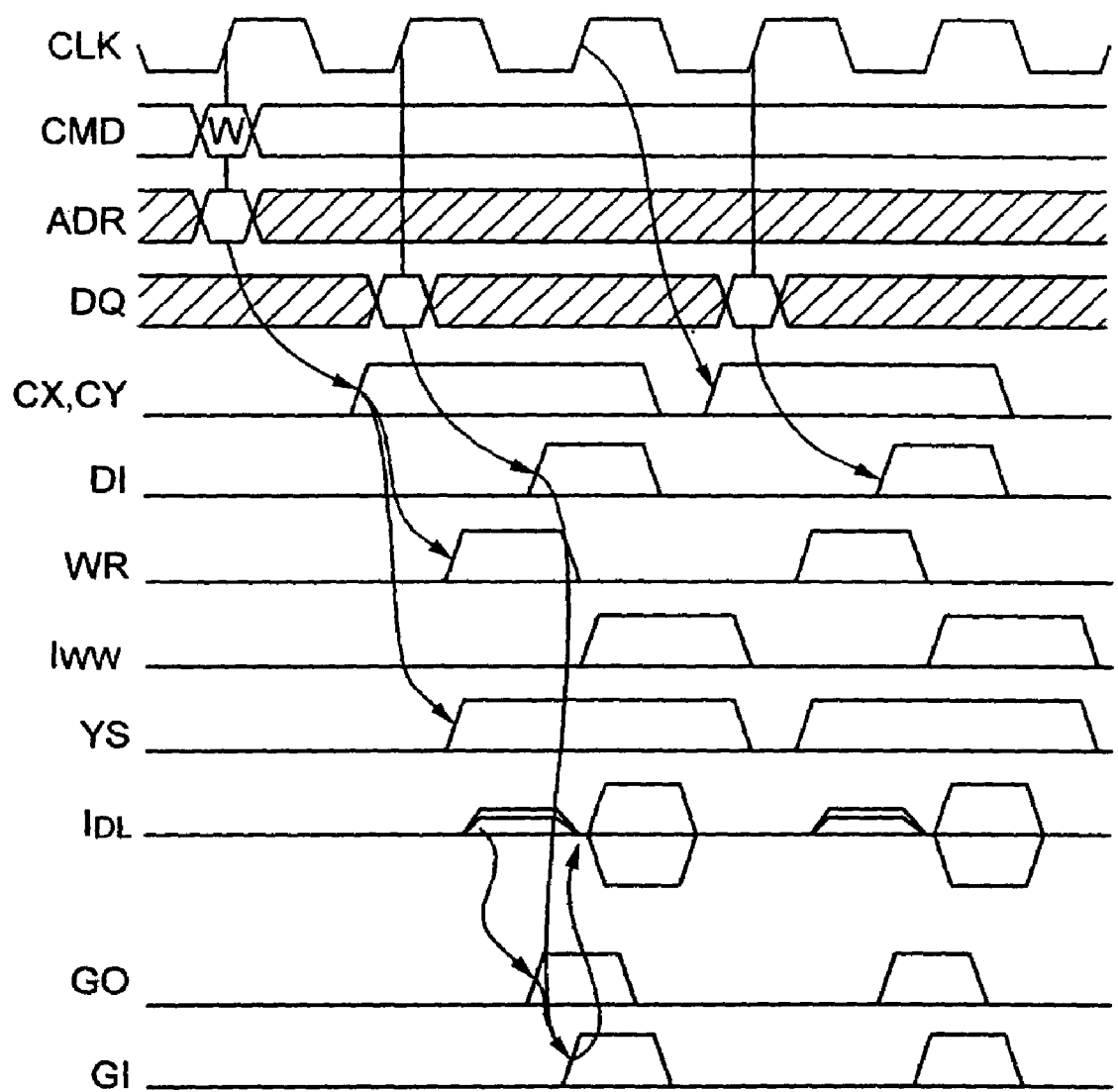
FIG. 16 is a timing chart of a write operation of the synchronous MRAM according to the present invention.

FIG. 16 shows an example of the timing of the write operation. When a read command W is given, the row and column addresses are taken into the address buffer AB from the address ADR. The column address taken from the address buffer AB is used as the initial value to operate the address counter ACT every two cycles of the clock CLK, and the row address BX and column address BY are outputted. On receiving the addresses, the row address pre-decoder XPD outputs the row pre-decode address CX, and the column address pre-decoder YPD outputs the column pre-decode address CX. In the memory array MAR, first the read word line WR and column selection signal YS are selected. Thereby, the data line current IDL flows through the selected data line. This is detected by the sense amplifier SA to output the read data GO. On the other hand, in the next clock cycle to which the write command is inputted, the input buffer DIB takes in the input/output data DQ, and outputs the input data DI. The data encoder WC compares the input data DI with the read data GO and encodes the input data as the write data GI. The read word line WR is reset, and a desired current is passed through the write word line current IWW. Moreover, the write buffer passes the current through the data line in response to the write data GI. As a result, the desired memory cell is subjected to the inverting/writing. The above-described operation is repeated every two cycles of the clock CLK.

With the synchronous memory described above, the command and address are taken in and data is inputted/outputted in synchronization with the external clock CLK. By this synchronous memory, the operation in a high frequency is possible, and high data rate can be realized. For the MRAM according to the present invention, various high-speed memory systems developed with respect to SRAM and DRAM can be applied.

In this example, the write operation is performed every two cycles of the clock CLK, whereas the read operation of FIG. 15 is performed in the same cycle as that of the clock CLK. This is because the inverting/writing is performed in the write operation after the read operation from the memory cell, and the cycle time becomes longer than that of the write operation. Since the write operation is performed in this manner every two cycles, the clock cycle time as the read cycle can be shortened. Depending on the circumstances, the write operation can also be performed every clock cycle. In this case, the clock cycle time becomes longer. However, since the cycle of the read operation is matched with that of the write operation, control is facilitated.

Moreover, in the write operation of FIG. 16, the input data is taken in one cycle after the clock CLK with respect to the write command, and the write latency is set to 1. Even in this case, since the write operation of the memory cell is performed after the read operation, the input data cannot be a critical path. When the write latency is set to 1, a difference from the read latency is reduced, and the use efficiency of the bus of the input/output data DQ can be enhanced.

In FIGS. 15 and 16, in response to the read command R or write command W, the row and column addresses are simultaneously taken in. Thereby, there is not a delay time from the taking-in of the row address until the taking-in of the column address, which is generally required in DRAM, and only the information of the selected data line can be detected. Different from the DRAM, non-destructive read is possible in the MRAM, the data of all the memory cells on the word line does not have to be detected, and therefore the above-described operation is possible. Since only the information of the selected data line is detected, the power consumption can be reduced.

FIG. 8 shows the constitution in which each memory cell MC includes one MTJ element MTJ and one transistor MT. As described in Document 4:2000 IEEE International Solid-State Circuits Conference, Digest of Technical Papers, pp. 128 to 129, the present invention can also be applied to the memory array including the memory cell constituted of two MTJ elements and two transistors. An effect that the current consumption at the write time is reduced can similarly be obtained. In this memory array, since the data line current at the write time is passed in a loop form, the memory array can be controlled on one side, and the constitution of the data line control circuit can be simplified.

Second Embodiment

Figure 17:
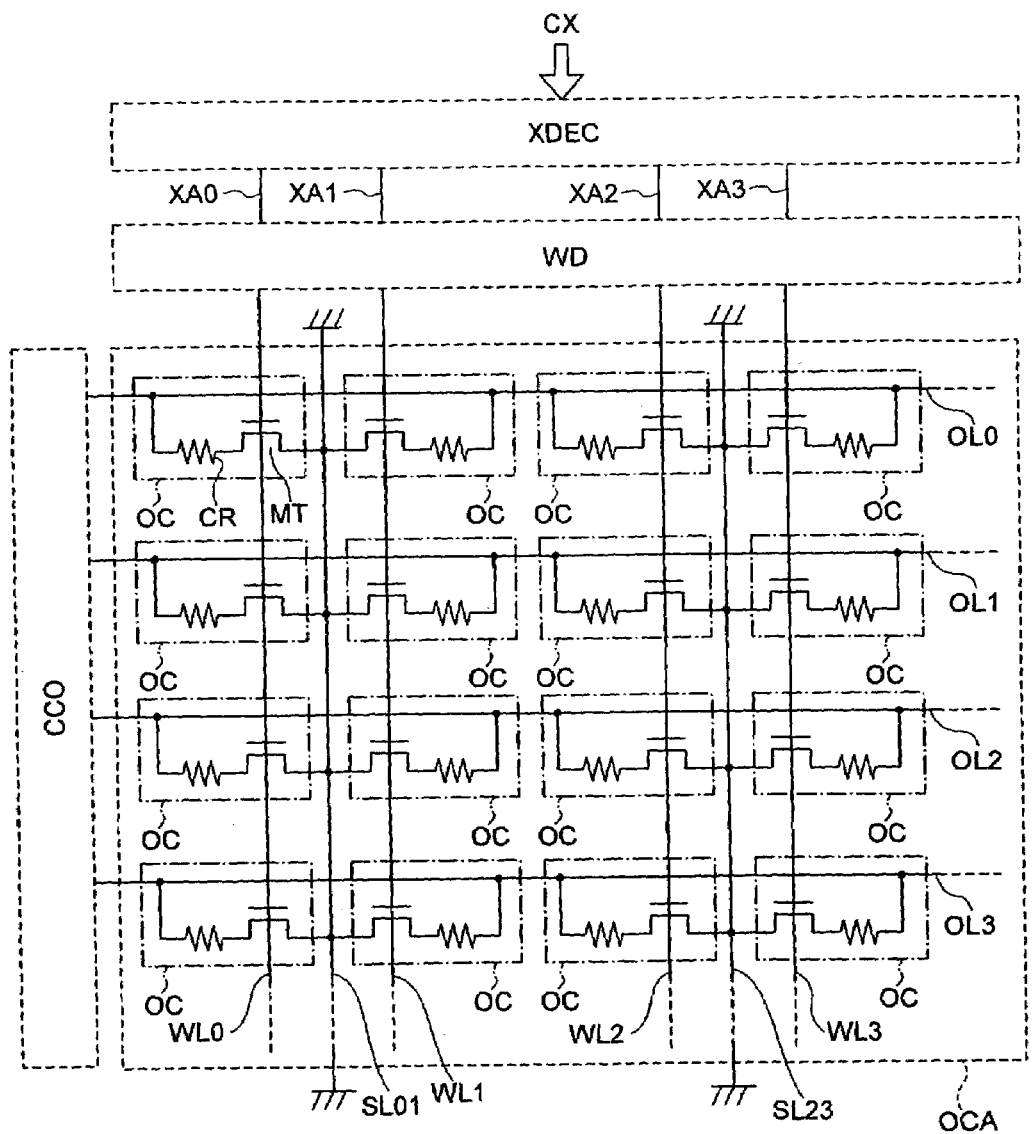
FIG. 17 is a diagram showing the constitution example of the memory array of a phase change memory.

The method of reducing the number of written bits as described in the first embodiment is effective not only for the MRAM but also for the phase change memory. The phase change memory to which the present invention is applied can be constituted in the same manner as in the MRAM in FIG. 1, and data encoder and decoder shown in FIGS. 2 to 7 can be used. FIG. 17 shows the constitution example of the memory array. The constitution is used as the memory array MAR in FIG. 1. The constitution includes a memory cell array OCA, row decoder XDEC, word driver group WD, and data line control circuit CCO. Here, in the same manner as in FIG. 8, for the sake of simplicity, a dummy cell for generating a reference signal is omitted. Moreover, this constitution may be repeated to form the memory array MAR of FIG. 1 depending on the memory capacity. The memory cell array OCA includes memory cells OC disposed in the intersections of word lines WL0, WL1, WL2, WL3, . . . with data lines OL0, OL1, OL2, OL3, . . . The memory cells OC are also connected to source lines SL01, SL23, . . . whose opposite ends are grounded. Each memory cell includes one phase change resistance CR and one transistor MT. The phase change resistance CR is formed of a chalcogenide material, and is in low and high resistance states depending on conditions. The word lines WL0, WL1, WL2, WL3, . . . are driven by the word driver group WD. The row decoder XDEC decodes the column pre-decode address CX, and outputs row decode signals XA0, XA1, XA2, XA3, . . . to the word driver group WD. In response to the output, the word driver group WD selectively drives the word lines WL0, WL1, WL2, WL3, . . . The data lines OL0, OL1, OL2, OL3, . . . are controlled by the data line control circuit CCO including the sense amplifier and write buffer.

Figure 18:
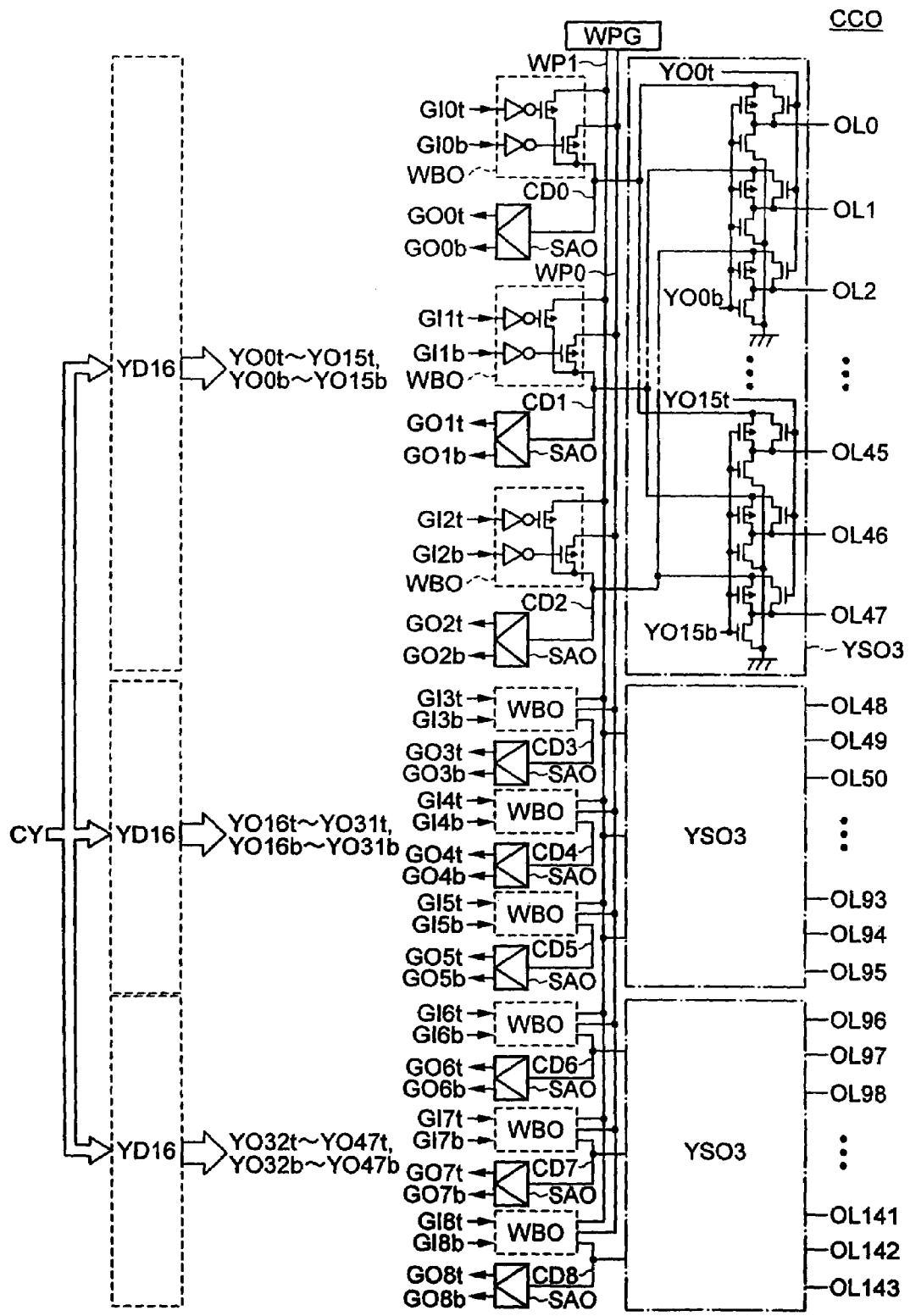
FIG. 18 is a diagram showing the constitution example of the data line control circuit in FIG. 17.

FIG. 18 shows the constitution example of the data line control circuit CCO in FIG. 17. Here, in the same manner as in FIG. 9, the example of read or write of nine bits performed with respect to 144 data lines DL0 to DL143 will be described, and the constitution is divided in three every three bits. The circuit includes three column decoders YD16, write pulse generation circuit WPG, nine write buffers WBO, nine sense amplifiers SAO, and three column selectors YSO3. In the same manner as in the data line control circuit CCN of the MRAM shown in FIG. 9, the column decoders YD16 decode the column pre-decode address CY, and select one pair from 16 pairs of column selection signals YO0$t$ to YO15$t$ and YO0$b$ to YO15$b$, YO16$t$ to YO31$t$ and YO16$b$ to YO31$b$, and YO32$t$ to YO47$t$ and YO32$b$ to YO47$b$ of the complementary signals. The column selector YSO3 has the same constitution as that of the column selector YSN3 in FIG. 9. In each column selector, 48 data lines OL0 to OL47, OL48 to OL95, OL96 to OL143 are connected to one PMOS transistor and two NMOS transistors controlled by the column selection signal pairs. Three of 48 data lines are connected to the common data lines CD0 to CD2, CD3 to CD5, CD6 to CD8. The non-selected data line is kept at the ground voltage VSS. The write pulse generation circuit WPG outputs pulses for writing '1' and '0' to write pulse lines WP1, WP0. The write buffers WBO are constituted of two inverters and two PMOS transistors, receive the write data GI0$t$ to GI8$t$, GI0$b$ to GI8$b$, and connect the common data lines CD0 to CD8 to write pulse lines WP1, WP0. For example, when the write data GI0$t$ is high, the common data line CD0 is connected to the write pulse line WP1. When GI0$b$ is low, CD0 is connected to WP0. Here, when both the write data GI0$t$, GI0$b$ are low, in the same manner as in the write buffers WBN in FIG. 9, the high impedance state is obtained. During the read operation of the memory cell, sense amplifiers SAO detect the signals of the common data lines CD0 to CD8, and output the read data GO0$t$ to GO8$t$, GO0$b$ to GO8$b$.

Figure 19:
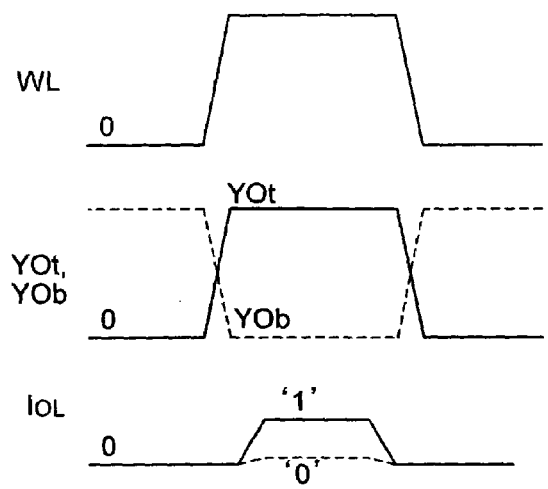
FIG. 19 is a diagram showing the read operation of the memory cell of the phase change memory.

The read operation is performed as shown in FIG. 19. That is, the operation comprises: setting a word line WL selected from WL0, WL1, WL2, WL3, . . . to the high level; achieving the electric continuity of the transistor MT in the memory cell connected to the word line; selecting desired column selection signal pair YOt, YOb; and applying the voltage between the terminals of the phase change resistance CR. The operation further comprises: reading the stored information from the memory cell OC by a current IOL flowing through the data line in accordance with the state of the phase change resistance CR; detecting the information by the sense amplifier SAO; and outputting the read data GO. Here, a period in which the data line current IOL flows is determined by the sense amplifier SAO.

Figure 20:
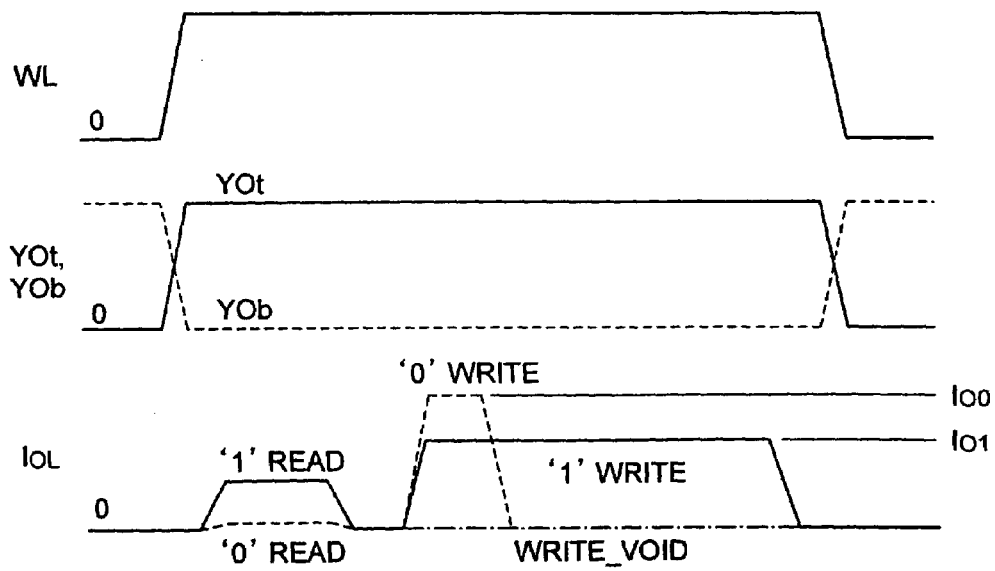
FIG. 20 is a diagram showing the write operation of the memory cell of the phase change memory.

On the other hand, the write operation is performed as shown in FIG. 20. That is, in the same manner as in the read operation, the read operation is performed from the memory cells OC. Here, the word line WL and column selection signal pair YOt, YOb are kept as such. The write data is determined in accordance with the read data. Accordingly, the write into the memory cell OC is performed by passing the data line current to generate heat and changing the state of the phase change resistance CR. When the inverting/writing is performed, the write current is passed through the data line by the write pulse generation circuit WPG and write buffer WBO in the data line control circuit CCO. In the write of '1' ('1' WRITE), a small current IO1 is applied with a long pulse width, and the phase change resistance CR is annealed and lowered. In the write of '0' ('0' WRITE), a large current IO0 is applied with a short pulse width, and the phase change resistance CR is set to be amorphous and raised. If the inverting/writing is unnecessary (WRITE_VOID), the data line current IOL is kept at 0.

In this manner, also in the phase change memory, in the same manner as in the first embodiment, the number of bits for performing the write is reduced and the current consumption can be reduced. Especially in the phase change memory, it is possible to obtain an effect that temperature rise is inhibited and operation is stabilized. When the write is simultaneously performed with respect to a large number of memory cells OC, the temperature of the whole memory cell array rises, and the temperature drop after applying the pulse of the data line current IOL is delayed. Therefore, even when '0' WRITE is performed with a short pulse, there is a possibility of the low resistance state. According to the present invention, when the maximum number of bits to be written is reduced by half, this problem can be avoided.

Moreover, in the phase change memory, there is a fear of deterioration of the phase change resistance by the repetition of the write operation. According to the present invention, since the number of write operations per memory cell can be reduced on average, the deterioration of the phase change resistance is reduced, and reliability can be enhanced.

Different from the operation of the MRAM described with reference to FIGS. 12 and 13, the word line WL is set to the high level both in the read and write operations in the phase change memory. Therefore, the word line WL is kept at the high level in the write operation, and the write operation is performed subsequently to the read operation. Therefore, with respect to the current consumption and delay time of a peripheral circuit, a penalty by performing the read operation before the write operation is small.

Third Embodiment

Figure 21:
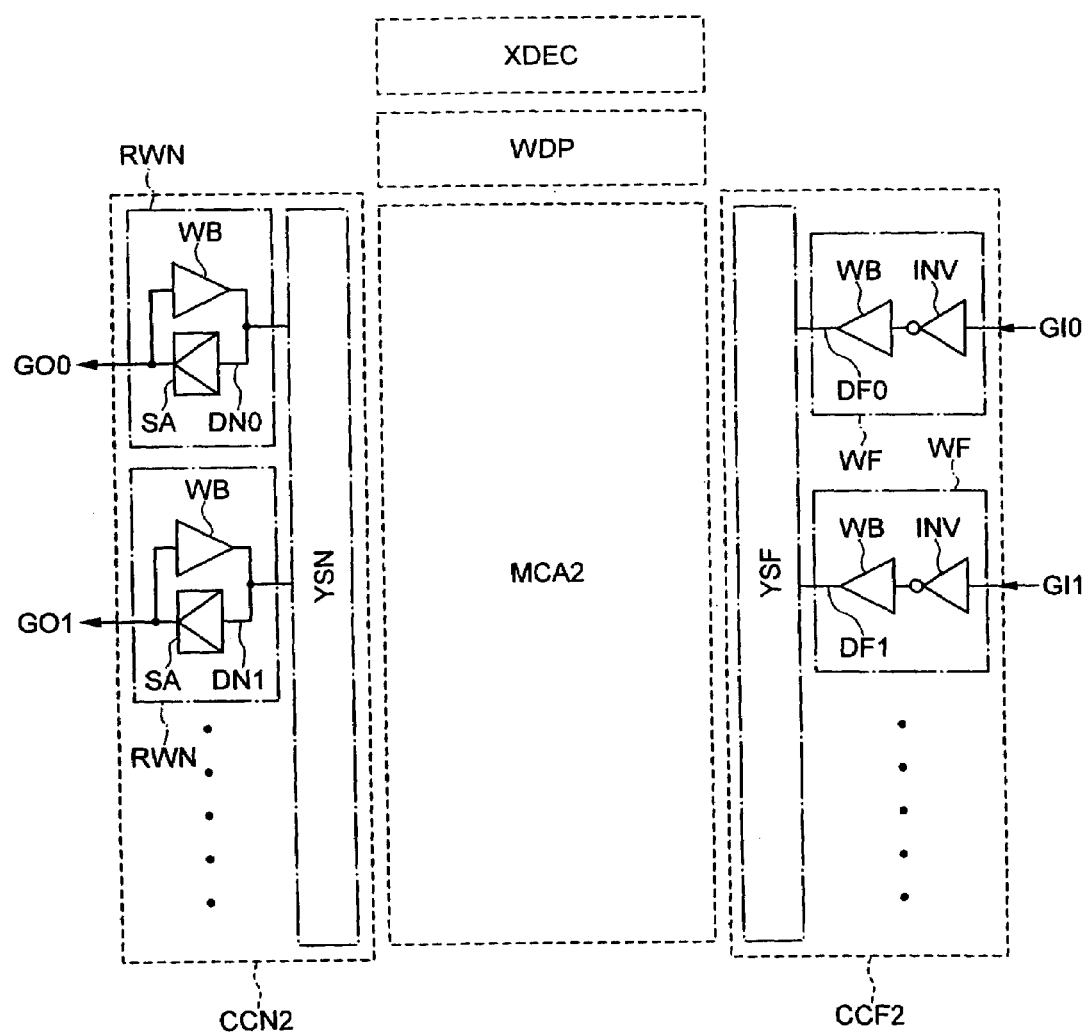
FIG. 21 is a diagram showing another constitution example of the memory array of the MRAM.

Next, an embodiment in which the coding is not used will be described with respect to the MRAM. FIG. 21 shows another constitution example of the memory array of the MRAM. For example, the whole MRAM is constituted by removing the data encoder WC and data decoder RD from FIG. 1. This memory array constitution includes the memory cell array MCA, row decoder XDEC, word driver group WDP, and data line control circuits CCN2, CCF2. The memory cell array MCA is constituted as shown in FIG. 8, although the number of data lines differs. The row decoder XDEC and word driver group WDP operate in the same manner as in FIG. 8.

The data line control circuit CCN2 includes a column selector YSN, and a plurality of read/write circuits RWN for the read data GO0, GO1, . . . Here, for the sake of simplicity, the column decoders are omitted. The column selector YSN is constituted in the same manner as in the column selector YSN3 in FIG. 9, and connects the desired data line to the common data lines DN0, DN1, . . . The read/write circuit RWN is constituted of the sense amplifier SA and write buffer WB. The read operation comprises: detecting the signals of the common data lines DN0, DN1, . . . read from the memory cell array by the sense amplifier SA; and outputting the read data GO0, G01, . . . The write operation also comprises: first detecting the signals of the common data lines DN0, DN1, . . . read from the memory cell array by the sense amplifier SA. In accordance with the result, the write buffer WB dries the data line via the common data lines DN0, DN1, . . . That is, when '1' is read, the line is driven at the high level. When '0' is read, the line is driven at the low level.

The data line control circuit CCF2 includes the column selector YSF, and a plurality of write circuits WF for the write data GI0, GI1, . . . Here, for the sake of simplicity, the column decoders are omitted. The column selector YSF is constituted in the same manner as in the column selector YSF3 in FIG. 10, and connects the desired data line to common data lines DF0, DF1, . . . The write circuit WF is constituted of the write buffer WB and inverter INV. The write operation comprises: inverting the inputted write data GI0, GI1, . . . ; and driving the data line via the common data lines DF0, DF1, . . . That is, when '1' is inputted, the line is driven at the high level. When '0' is inputted, the line is driven at the low level.

In the write operation, when the data line is driven as described above, and the read data agrees with the write data, the opposite sides of the data line are driven at the same level, and the current does not flow. In case of disagreement, the current flows through the data line between the data line control circuits CCN2, CCF2 in accordance with the write data. Thereby, the writing only of the bit to be reversed into the memory cell can be realized. With respect to the bit which does not have to be inverted/written, the data line current is not passed, and therefore the average current of the write operation can be reduced.

In the first embodiment, the coding by which the flag bit is added is used to reduce the number of bits to be inverted/written, and the maximum and average values of the number of bits to be written are simultaneously reduced. On the other hand, in the present embodiment, the inverting/writing is not performed, and the average value is reduced. The method is simple as compared with the first embodiment, and prevents the number of memory cells from increasing by adding the flag bit. Moreover, the write data may be inputted into only one of the data line control circuits on the opposite sides. Therefore, as compared with the related-art constitution, the number of wires is reduced, and the circuit constitution is simplified.

Fourth Embodiment

Figure 22:
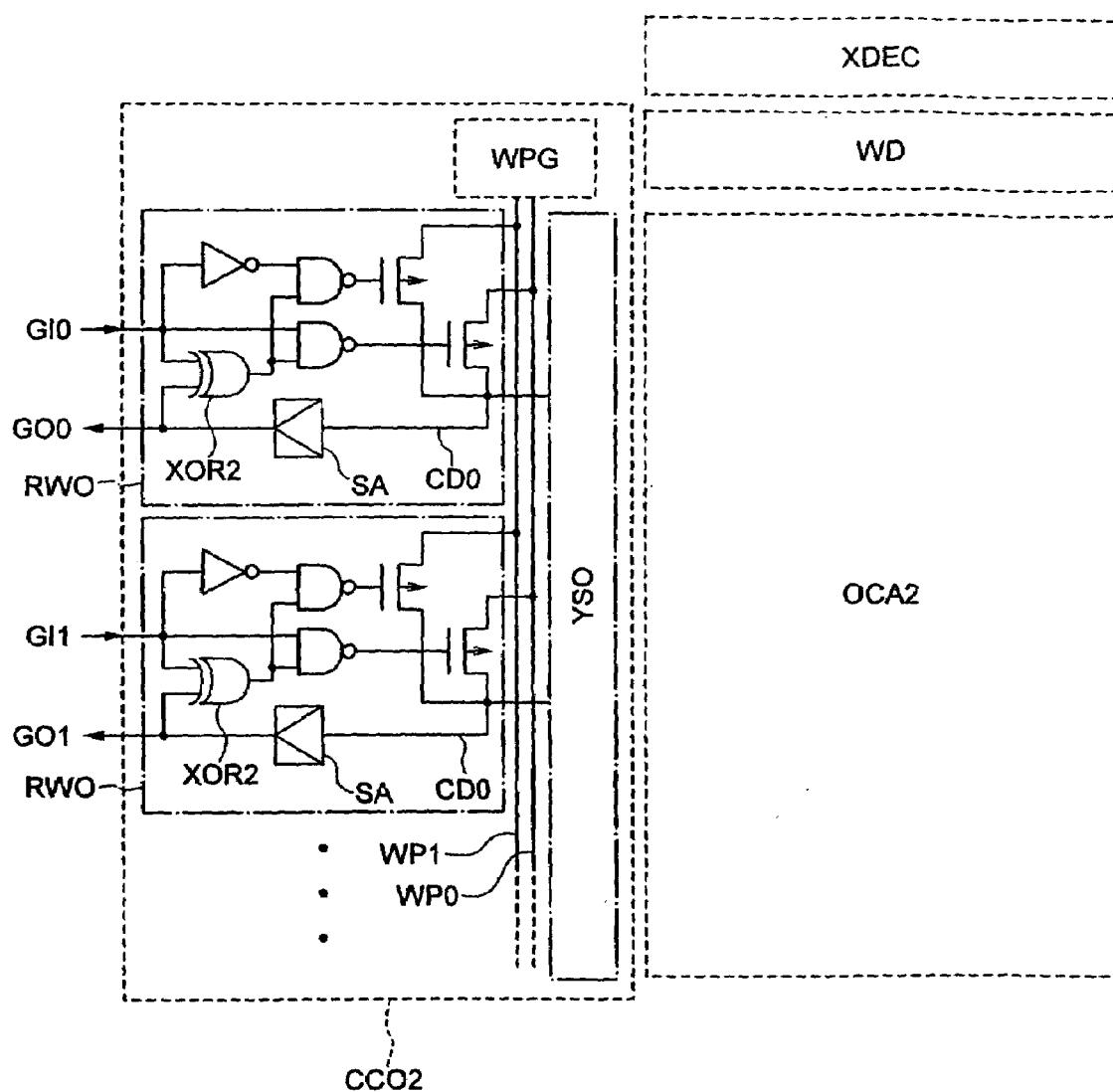
FIG. 22 is a diagram showing another constitution example of the memory array of the phase change memory.

Next, an embodiment in which the coding is not used in the phase change memory will be described. FIG. 22 shows a constitution example, different from that of FIG. 17, of the memory array of the phase change memory. For example, the whole phase change memory is constituted by removing the data encoder WC and data decoder RD from FIG. 1 in the same manner as in the third embodiment. This memory array constitution includes the memory cell array OCA2, row decoder XDEC, word driver group WD, and data line control circuit CCO2. The memory cell array OCA2 is constituted as shown in FIG. 17, although the number of data lines differs. The row decoder XDEC and word driver group WD operate in the same manner as in FIG. 17.

The data line control circuit CCO2 includes a column selector YSO, a plurality of read/write circuits RWO for the read data GI0, GI1, . . . , and write pulse generation circuit WPG. Here, for the sake of simplicity, the column decoders are also omitted. The column selector YSO is constituted in the same manner as in the column selector YSO3 in FIG. 18, and connects the desired data line to the common data lines CD0, CD1, . . . The read/write circuit RWO is constituted of the sense amplifier SA, exclusive OR gate XOR2, inverter, two NAND gates, and two PMOS transistors. The read operation comprises: detecting the signals of the common data lines CD0, CD1, . . . read from the memory cell array by the sense amplifier SA; and outputting the read data GO0, GO1, . . . The write operation also comprises: first detecting the signals read from the memory cell array by the sense amplifier SA. The result is compared with the write data GI0, GI1, . . . by the exclusive OR gate XOR2. In case of disagreement, the exclusive OR gate XOR2 outputs '1', and the PMOS transistor connects the write pulse lines WP1, WP0 to the common data line. As a result, the pulses for writing '1' and '0' outputted to the write pulse lines WP1, WP0 by the write pulse generation circuit WPG are transmitted to the data line. Thereby, only the bit to be inverted can be written into the memory cell.

Even in the present embodiment, in the same manner as in the third embodiment, the data line current is not passed with respect to the bit which does not have to be inverted/ written, and the average current of the write operation can be reduced. It is to be noted that in Document 5: Japanese Patent Application Laid-Open No. 7-220479, a method is described comprising: using the exclusive OR gate to compare the sense amplifier output with the write data with respect to a static RAM; performing only the inverting/ writing; and reducing the current consumption of the writing. In the present invention, the method is applied to the phase change memory. In addition to the effect of the current consumption reduction, as described in the second embodiment, it is possible to obtain: an effect that the temperature rise of the whole memory cell array is inhibited and the writing is stabilized; and an effect that the number of the write operations of the phase change resistance is reduced, the deterioration is inhibited, and reliability is enhanced. Moreover, in Document 6: Japanese Patent Application Laid-Open No. 9-63286, a method is described comprising: comparing the read data with the input data with respect to EEPROM to control deletion and write circuits; and lengthening the life without performing any unnecessary deletion operation. In the method of Document 6, data to be operated at the same time are compared with each other and controlled. On the other hand, in the present embodiment, the bits are compared with each other, and it is judged whether or not to perform the write operation. Therefore, the present embodiment has a greater effect that the unnecessary writing is not performed, and is effective especially when the number of bits to be operated at the same time is large.

It is to be noted that even in the MRAM the present embodiment may also be constituted to use the exclusive OR gate to compare the sense amplifier output with the write data and to perform only the inverting/writing.

It is needless to say that the present invention described in the above-described embodiments can generally be applied not only to the unit MRAM and phase change memory but also to semiconductor devicees such as a system LSI in which the MRAM and phase change memory are mounted in a mixed manner. Even in this case, the effect described in each embodiment is obtained with respect to the MRAM or phase change memory.

According to the present embodiment, in a nonvolatile semiconductor memory in which the current is passed through the data line to write the data in the memory cell, the number of bits to be written during the write operation is reduced, and the current consumption can be reduced. Thereby, a semiconductor device including a low-power highly-integrated memory can be realized.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A semiconductor device comprising:
   a memory cell array including a word line, a plurality of data lines across the word line, and a plurality of memory cells provided at intersections of the word line and the plurality of data lines, the plurality of data lines being divided into a plurality of data line groups;
   a data encoder comparing write data with data stored in selected memory cells and encoding the write data according to the comparing result;
   a plurality of column selector groups each including a plurality of column selectors, each of the plurality of column selectors being coupled to corresponding one of the plurality of data lines;
   wherein when the word line is selected, each of the plurality of column selector groups selects at least one data line in corresponding to the data line group, and
   wherein the plurality of data lines in each of the plurality of data line groups are arranged in a row.

2. A semiconductor device according to claim 1, wherein the data encoder encodes the write data so that the number of memory cells in which the stored data is inverted is half or less in the selected memory cells.

3. A semiconductor device according to claim 2, wherein each of the plurality of column selector groups selects data lines in corresponding to the data line group.

4. A semiconductor device according to claim 3, wherein the memory cell array has a flag memory cell which stored information according to the comparing result, and
   wherein when the word line is selected, data stored in the flag memory cell are read out via the column selector included in one of the plurality of column selector groups.

5. A semiconductor device according to claim 4, further comprising:
   a write buffer supplying a write current to the plurality of data lines,
   wherein when data stored in the selected memory cell is inverted, the write buffer supplies the write current, and
   wherein when data stored in the selected memory cell is not inverted, the write buffer does not supply the write current.

6. A semiconductor device according to claim 5, wherein the write buffer is high impedance state when not supplying the write current.

7. A semiconductor device according to claim 1, wherein each of the plurality of memory cells has a phase change element.

* * * * *